(12) United States Patent
Takigawa (10) Patent No.: US 10,404,382 B2
(45) Date of Patent: Sep. 3, 2019

(54) GROUNDING CIRCUIT AND GROUNDING METHOD

(71) Applicant: NEC Corporation, Minato-ku, Tokyo (JP)

(72) Inventor: Yoshinari Takigawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/074,478

(22) PCT Filed: Feb. 13, 2017

(86) PCT No.: PCT/JP2017/005079
§ 371 (c)(1),
(2) Date: Aug. 1, 2018

(87) PCT Pub. No.: WO2017/141855
PCT Pub. Date: Aug. 24, 2017

(65) Prior Publication Data
US 2019/0044621 A1    Feb. 7, 2019

(30) Foreign Application Priority Data
Feb. 17, 2016  (JP) .................................. 2016-028066

(51) Int. Cl.
*H02H 9/02*   (2006.01)
*H04B 10/80*  (2013.01)
*H02H 9/04*   (2006.01)
(Continued)

(52) U.S. Cl.
CPC ..... *H04B 10/808* (2013.01); *G01R 19/16533* (2013.01); *H01H 45/14* (2013.01);
(Continued)

(58) Field of Classification Search
CPC .................................................. H04B 10/808
See application file for complete search history.

(56) References Cited

U.S. PATENT DOCUMENTS

2002/0126435 A1* 9/2002 Pirovano .................. H04B 3/44
                                                   361/191
2003/0015921 A1* 1/2003 Kumayasu ............... H04B 3/44
                                                   307/131
(Continued)

FOREIGN PATENT DOCUMENTS

CN    201312117 Y    9/2009
CN    103490406 A    1/2014
(Continued)

OTHER PUBLICATIONS

International Search Report for PCT Application No. PCT/JP2017/005079, dated Apr. 25, 2017.
(Continued)

*Primary Examiner* — Daniel J Cavallari (57) ABSTRACT

In order to suppress both large current and arc discharge during hot switching, a grounding circuit includes a first relay, a second relay, and a third relay, a first resistance connected in series with the first relay and is capable of connecting the feeding path to the ground, and a voltage divider connected in series with the second relay and the third relay and is connectable in such a way as to divide voltage between the feeding path and the ground, the third relay being disposed at a point at which the voltage is divided, and when the feeding path is to be connected to the ground, the feeding path is connected to the ground via the first resistance by the first relay, the voltage divider is connected in parallel with the first relay and the first resistance, and a connection to the ground is cut off.

11 Claims, 12 Drawing Sheets

(51) Int. Cl.
   *H04B 3/44*     (2006.01)
   *G01R 19/165*   (2006.01)
   *H01H 45/14*    (2006.01)
   *H01H 47/00*    (2006.01)
   *H02H 9/08*     (2006.01)

(52) U.S. Cl.
   CPC ............ *H01H 47/001* (2013.01); *H02H 9/02* (2013.01); *H02H 9/04* (2013.01); *H02H 9/08* (2013.01); *H04B 3/44* (2013.01)

(56) References Cited

U.S. PATENT DOCUMENTS

2003/0218389 A1   11/2003   Bianchi
2015/0131191 A1   5/2015    Androni et al.

FOREIGN PATENT DOCUMENTS

| JP | H04-323917 A | 11/1992 | |
| JP | 2001-230707 A | 8/2001 | |
| JP | 2015-109643 A | 6/2015 | |
| JP | 2015109643 A * | 6/2015 | ........... H04B 10/808 |

OTHER PUBLICATIONS

English translation of Written opinion for PCT Application No. PCT/JP2017/005079.
Japanese Office Action for JP Application No. 2018-500097 dated May 7, 2019 with English Translation.
Chinese Office Action for CN Application No. 201780011493.0 dated Jun. 27, 2019 with English Translation.

* cited by examiner

GROUNDING CIRCUIT AND GROUNDING METHOD

This application is a National Stage Entry of PCT/JP2017/005079 filed on Feb. 13, 2017, which claims priority from Japanese Patent Application 2016-028066 filed on Feb. 17, 2016, the contents of all of which are incorporated herein by reference, in their entirety.

TECHNICAL FIELD

The present invention relates to a grounding circuit and a grounding method and, in particular, to a grounding circuit and a grounding method that are used in a feed circuit of a submarine repeater.

BACKGROUND ART

With an increase in transmission capacity, an expansion of repeater spans, and an increase in the number of fibers in a submarine cable communication system in recent years, electric power required in a submarine branching unit is increasing. In order to supply higher power to a submarine branching unit, voltage of power supplied to the submarine branching unit needs to be increased. To that end, a submarine branching unit that is capable of switching a feed circuit at high voltage when switching a communication route due to a failure in a submarine cable, for example, is demanded.

Figure 11:
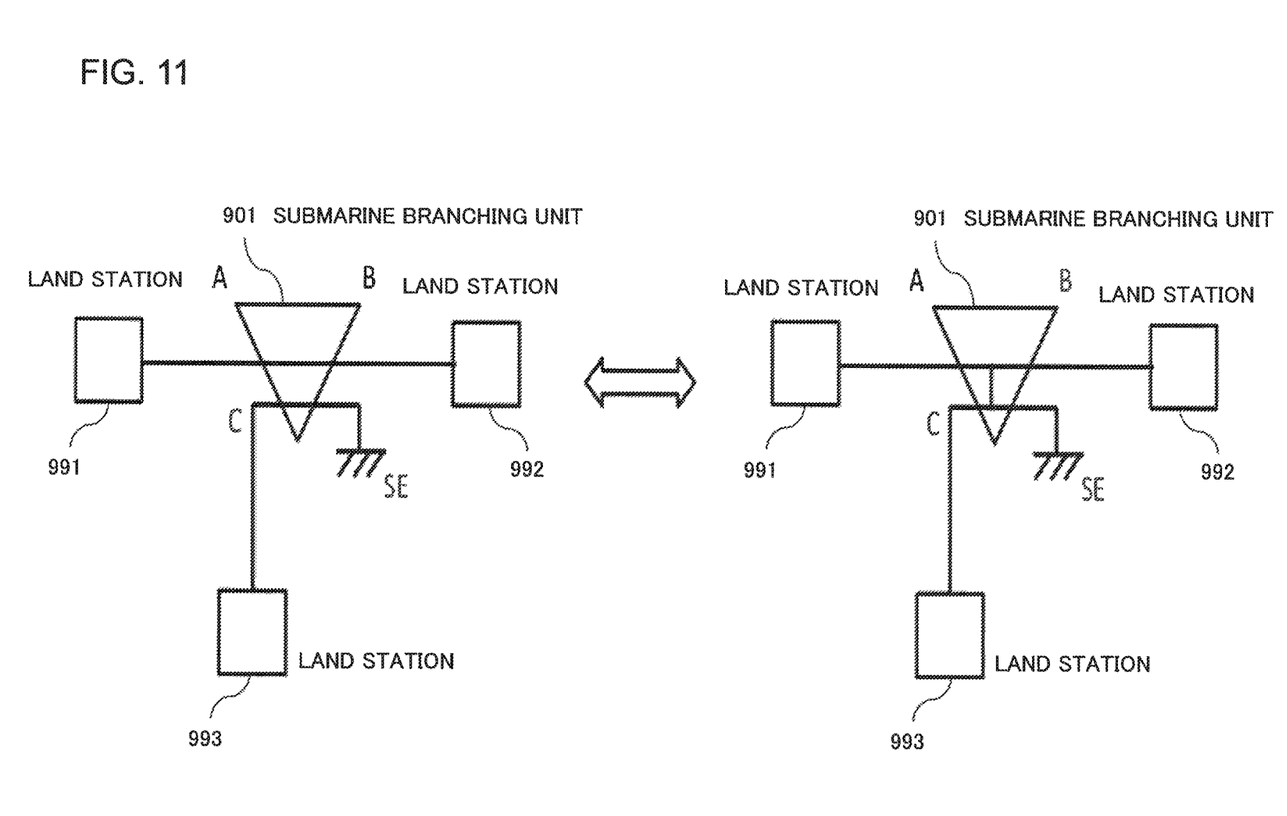
FIG. 11 is a diagram illustrating connections between a submarine branching unit and land stations, which are related to the present invention.

FIG. 11 is a diagram illustrating connections between a submarine branching unit (hereinafter abbreviated as "BU") and land stations, which are related to the present invention. In FIG. 11, a BU 901 is connected to land stations 991, 992, and 993 through submarine cables that include power feeding lines, and switches a feed circuit in response to a signal received from any of the land stations 991, 992, and 993. By the switching, the feed circuit of the BU 901 can be connected to a sea earth (hereinafter abbreviated as "SE") under the sea (the right-hand diagram in FIG. 11) or disconnected from the sea earth (the left-hand diagram in FIG. 11).

Figure 12:
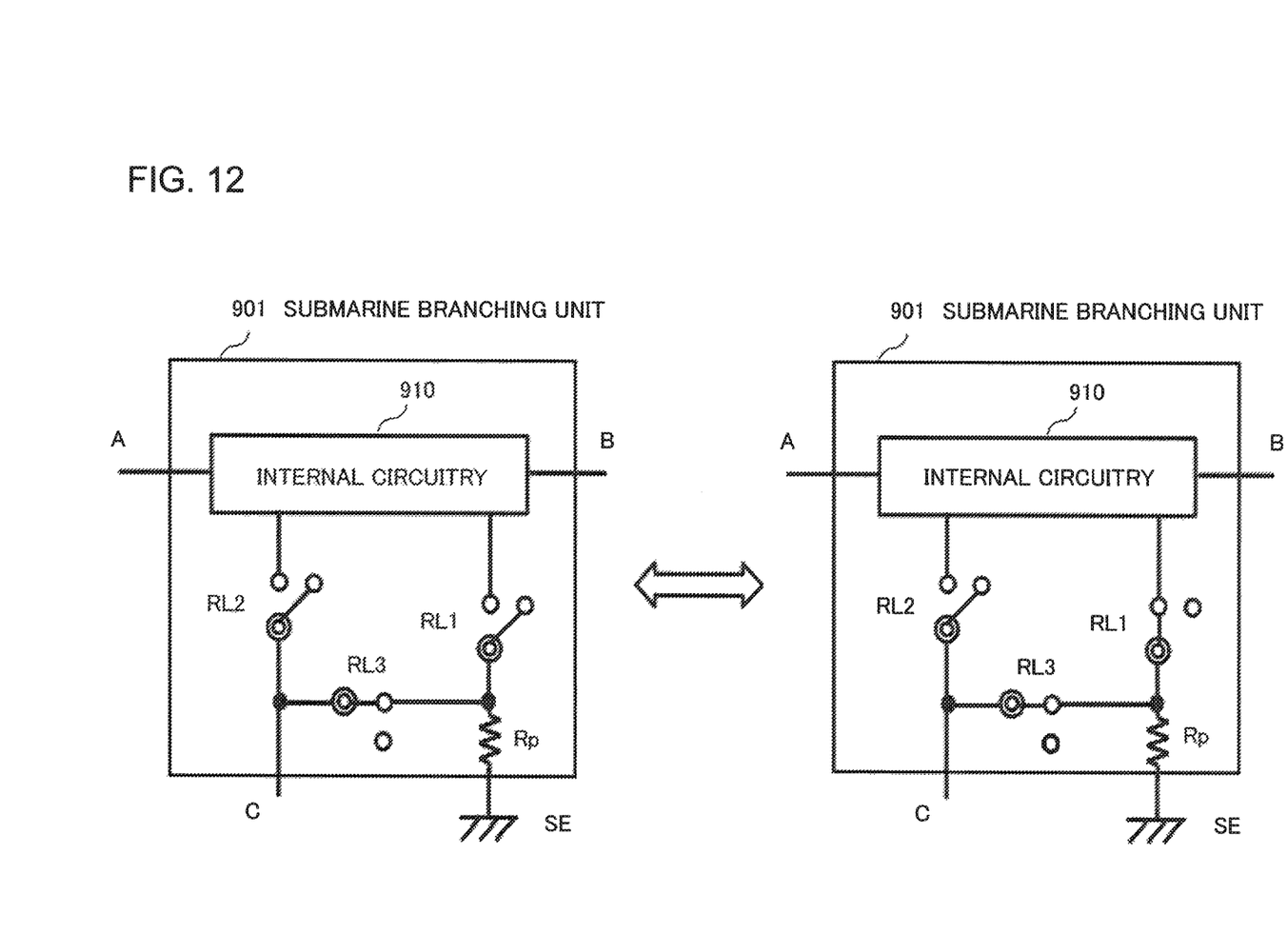
FIG. 12 is a diagram illustrating an example of a power feed switching circuit of a BU 901 that is related to the present invention.

FIG. 12 is a diagram illustrating an example of the feed circuit of the BU 901. Internal circuitry 910 includes an electrical circuit that processes optical signals to be transmitted. The feed circuit supplies power to the electrical circuit. As illustrated in FIG. 12, the feed circuit of the BU 901 includes three relays RL1 to RL3. By controlling the relays RL1 to RL3, a state of grounding of the feed circuit of the BU 901 to the SE can be switched. The left-hand side of FIG. 12 illustrates a state in which the internal circuitry is disconnected from the sea earth and the right-hand side of FIG. 12 illustrates a state in which a grounding potential of the internal circuitry is dropped to the sea earth.

Further, in relation to the present invention, PTL 1 describes a technique relating to power feed switching of a submarine branching unit.

CITATION LIST

Patent Literature

PTL 1: Japanese Unexamined Patent Application Publication No. H04-323917

SUMMARY OF INVENTION

Technical Problem

In FIG. 12, when the internal circuitry is connected to the sea earth, the relay RL1 is switched in a current flowing state (hot switching). Accordingly, when the internal circuitry 910 of the BU 901 is supplied with power at a high voltage exceeding several kilovolts, large current may flow through the relay RL1 immediately after the relay RL1 is closed. The current at this time may accelerate degradation of a relay contact. Current flowing through during switching can be decreased by increasing a resistance value of a resistance Rp connected between the relay RL1 and the sea earth. However, there is a problem that, when the resistance Rp is a high resistance, power consumption in the entire BU 901 increases.

On the other hand, when removing the grounding of the internal circuitry 910 to the sea earth by opening a contact of the relay RL1 in the right-hand diagram of FIG. 12, current flowing through the relay RL1 and the resistance Rp to the sea earth needs to be cut off. In this case, arc discharge may be generated at the contact of the relay RL1 due to voltage applied to the contact right before the switching. Since arc discharge accelerates degradation of the contact of the relay RL1, suppressing generation of arc discharge leads to improvement of reliability of a relay contact. In order to suppress generation of arc discharge by reducing voltage being applied to the contact of the relay RL1, it is desirable to reduce the resistance Rp and to decrease the voltage at the contact of the relay RL1.

As described above, in order to suppress large current during hot switching, the resistance Rp between a contact of the relay RL1 and the sea earth needs to be increased. On the other hand, in order to suppress arc discharge, the resistance Rp needs to be decreased in such a way as to decrease voltage at the contact of the relay RL1. In other words, there is a problem with the submarine branching unit 901 illustrated in FIG. 12 that mutually contradictory demands exist for a resistance value of the resistance Rp. PTL 1 does not describe any technique for solving such a problem.

OBJECT OF INVENTION

An object of the present invention is to provide a grounding circuit and a grounding method that are capable of suppressing both large current and arc discharge during hot switching.

Solution to Problem

A grounding circuit according to the present invention is a grounding circuit used for connecting a feeding path to a ground and includes:

a first relay, a second relay and a third relay;

a first resistance that is connected in series with the first relay and is capable of connecting the feeding path to the ground by using the first relay; and a voltage divider that is connected in series with the second relay and the third relay and is connectable in such a way as to divide voltage between the feeding path and the ground; wherein the third relay is disposed at a point at which the voltage is divided;

when the feeding path is to be connected to the ground, the first to third relays are controlled in such a way that the feeding path is connected to the ground via the first resistance by the first relay, the voltage divider is connected in parallel with the first relay and the first resistance by the second and third relays, and a connection to the ground by the first resistance is cut off by the first relay; and when the connection of the feeding path to the ground is disconnected, the first to third relays are controlled in such a way that a ground current is cut off by the third relay.

A grounding method according to the present invention is a grounding method for connecting a feeding path to a ground and includes:

connecting a first relay with a first resistance in series;

connecting a second relay with a voltage divider and a third relay in series;

disposing the third relay at a point at which voltage between the feeding path and the ground is divided by the voltage divider;

when the feeding path is to be connected to the ground, controlling the first to third relays in such a way as to, by the first relay, connect the feeding path to the ground via the first resistance, by the second and third relays, connect the voltage divider with the first relay and the first resistance in parallel, and further, by the first relay, cut off only the connection to the ground by the first resistance; and when the connection of the feeding path to the ground is disconnected, controlling the first to third relays in such a way as to cut off a ground current by the third relay.

A program according to the present invention is a control program used in a grounding circuit that includes a function of connecting a feeding path to a ground, wherein the grounding circuit includes a first relay, a second relay, a third relay, a first resistance that is connected in series with the first relay and is capable of connecting the feeding path to the ground by using the first relay, and a voltage divider that is connected in series with the second relay and the third relay and is connectable in such a way as to divide voltage between the feeding path and the ground, the third relay being disposed at a point at which the voltage is divided, and the control program causes execution of procedures of:

when the feeding path is to be connected to the ground, controlling the first to third relays in such a way that the feeding path is connected to the ground via the first resistance by the first relay, the voltage divider is connected in parallel with the first relay and the first resistance by the second and third relays, and further, a connection to the ground by the first resistance is cut off by the first relay; and, when the connection of the feeding path to the ground is disconnected, controlling the first to third relays in such a way that a ground current is cut off by the third relay.

Advantageous Effects of Invention

The present invention enables suppression of both large current and arc discharge during hot switching.

EXAMPLE EMBODIMENT

Example embodiments of the present invention will be described with reference to the drawings. Arrows in each drawing referenced indicate examples of directions of signals for the purpose of explaining operations of example embodiments and do not limit types and directions of the signals.

First Example Embodiment

Figure 1:
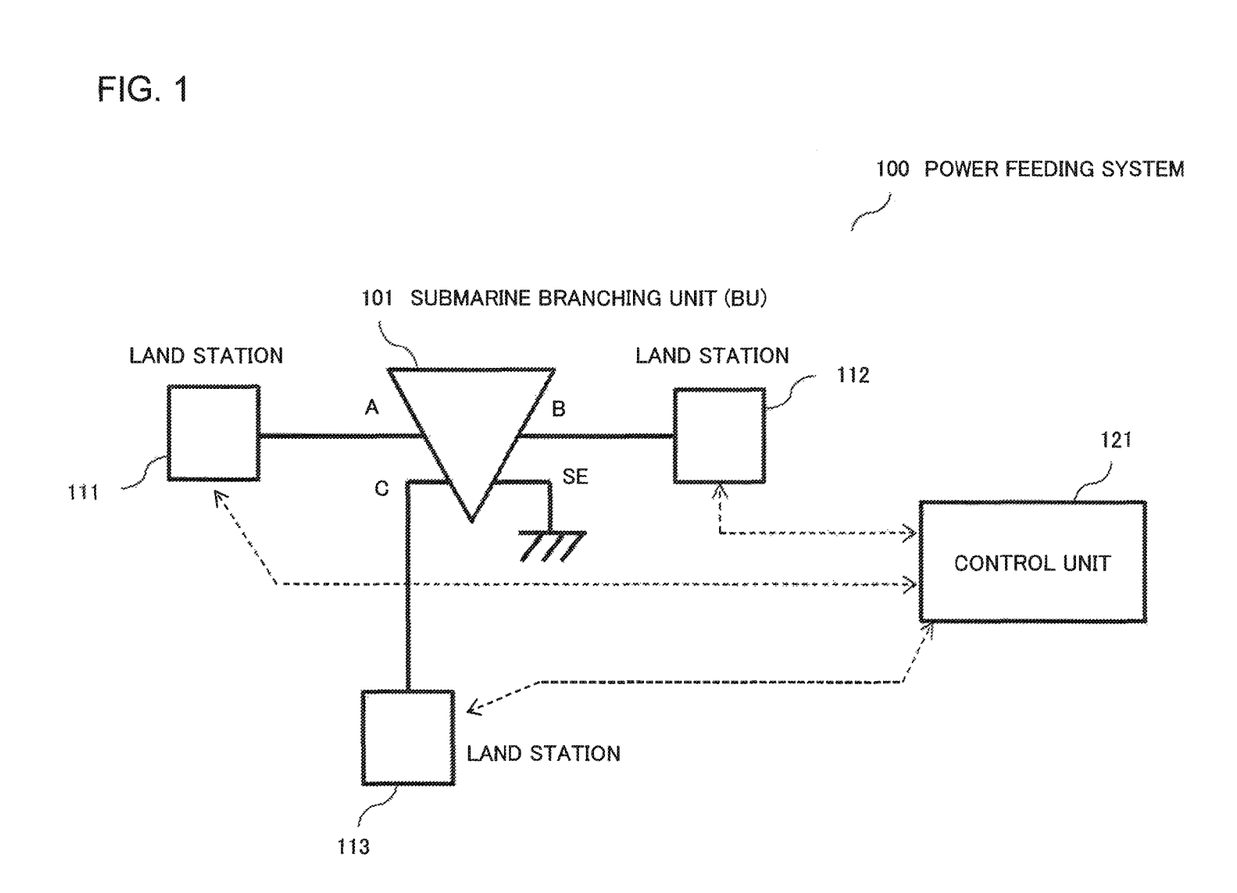
FIG. 1 is a block diagram illustrating a configuration example of a power feeding system 100 of a first example embodiment.

FIG. 1 is a block diagram illustrating a configuration example of a power feeding system 100 according to a first example embodiment of the present invention. In FIG. 1, the power feeding system 100 includes a submarine branching unit (BU) 101, land stations 111, 112 and 113, and a control unit 121. The BU 101 is a device that allows a submarine cable to branch and is installed on the floor of the sea. The BU 101 is connected to the land stations 111 to 113 through submarine cables and data are transmitted between the land stations.

Each of the land stations 111 to 113 includes a feeding device and a transmitter for the BU 101 and includes functions of monitoring and controlling the BU 101 by using signals sent to and received from the BU 101. The land stations 111 to 113 provide results of monitoring of the BU 101 to the control unit 121 and sends signals for controlling the BU 101, which are provided from the control unit 121, to the BU 101. A workstation or board computer may be used as the control unit 121.

The control unit 121 monitors a power feed sate of the BU 101 based on results of monitoring received from the land stations 111 to 113 and controls the feed circuit of the BU 101. The control unit 121 generates a signal (relay control signal) including an instruction to switch a relay for switching the feed circuit provided in the BU 101 and provide the instruction to the BU 101 by way of any of the land stations 111 to 113. The control unit 121 may further include a function of monitoring a voltage potential of the feed circuit of the BU 101.

The BU 101 operates on power supplied from at least one of the land stations 111 to 113. The BU 101 includes a function of switching a state of connection to a sea earth (SE) (i.e. a grounding state) of the feed circuit by controlling a relay of the feed circuit in accordance with a relay control signal received through a submarine cable from any of the land stations 111 to 113. Switching of the grounding state of the feed circuit is performed in the event of a failure in a feeding path between the BU 101 and any of the land stations 111 to 113 or at the time of submarine cable work, for example. Further, switching of the grounding state of the feed circuit may be autonomously performed in the power feeding system 100 or may be performed based on an instruction from a maintenance person.

Figure 2:
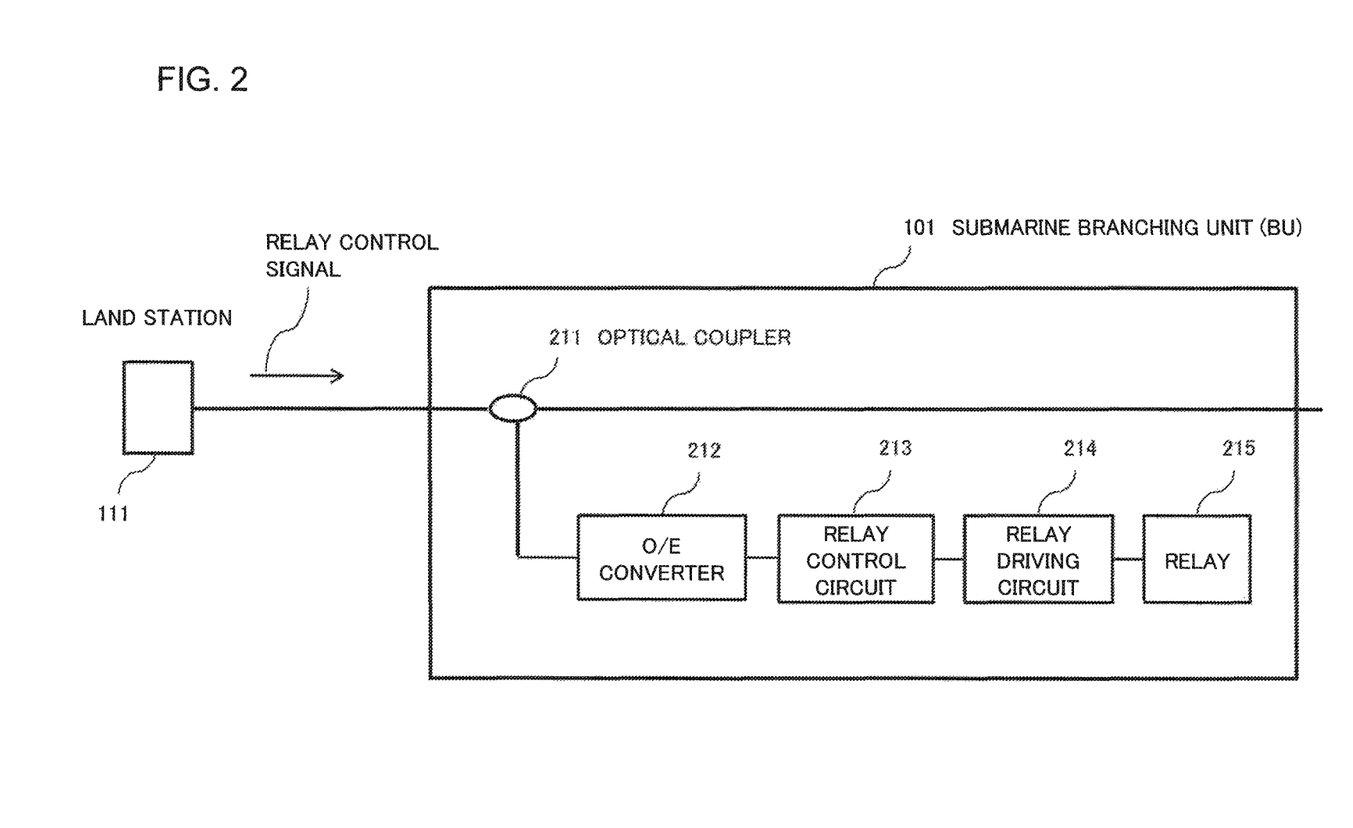
FIG. 2 is a block diagram illustrating a configuration example for controlling a relay provided in a BU 101.

FIG. 2 is a block diagram illustrating a configuration example for controlling a relay provided in the BU 101. The BU 101 includes an optical coupler 211, an optical/electrical (O/E) converter 212, a relay control circuit 213, a relay driving circuit 214, and a relay 215. The relay 215 is a relay included in the feed circuit. FIG. 2 depicts only a configuration for the BU 101 to control the relay 215 in accordance with an instruction from the land station 111 as an example. The relay 215 may be controlled by a signal received from a land station other than the land station 111.

The BU 101 receives an optical signal including a relay control signal from the land station 111. The relay control signal is generated by the control unit 121. The optical coupler 211 splits the received optical signal and inputs one of the split optical signals into the O/E converter 212. Another one of the split optical signals is sent to another BU or another land station by a relay function that the BU 101 includes.

The O/E converter 212 is a light receiving circuit that converts an optical signal input from the optical coupler 211 to an electrical signal. The relay control circuit 213 regenerates a relay control signal based on the electrical signal output from the O/E converter 212. The relay control signal includes information about the relay 215 to be controlled and information indicating a control instruction (to "open (break)" or "close (make)" a relay contact, for example) to the relay 215. Based on the relay control signal, the relay driving circuit 214 generates a signal having an amplitude that can drive a relevant relay 215. The relay 215 is a relay used for switching the feed circuit of the BU 101 and the BU 101 may include a plurality of relays 215.

Figure 3:
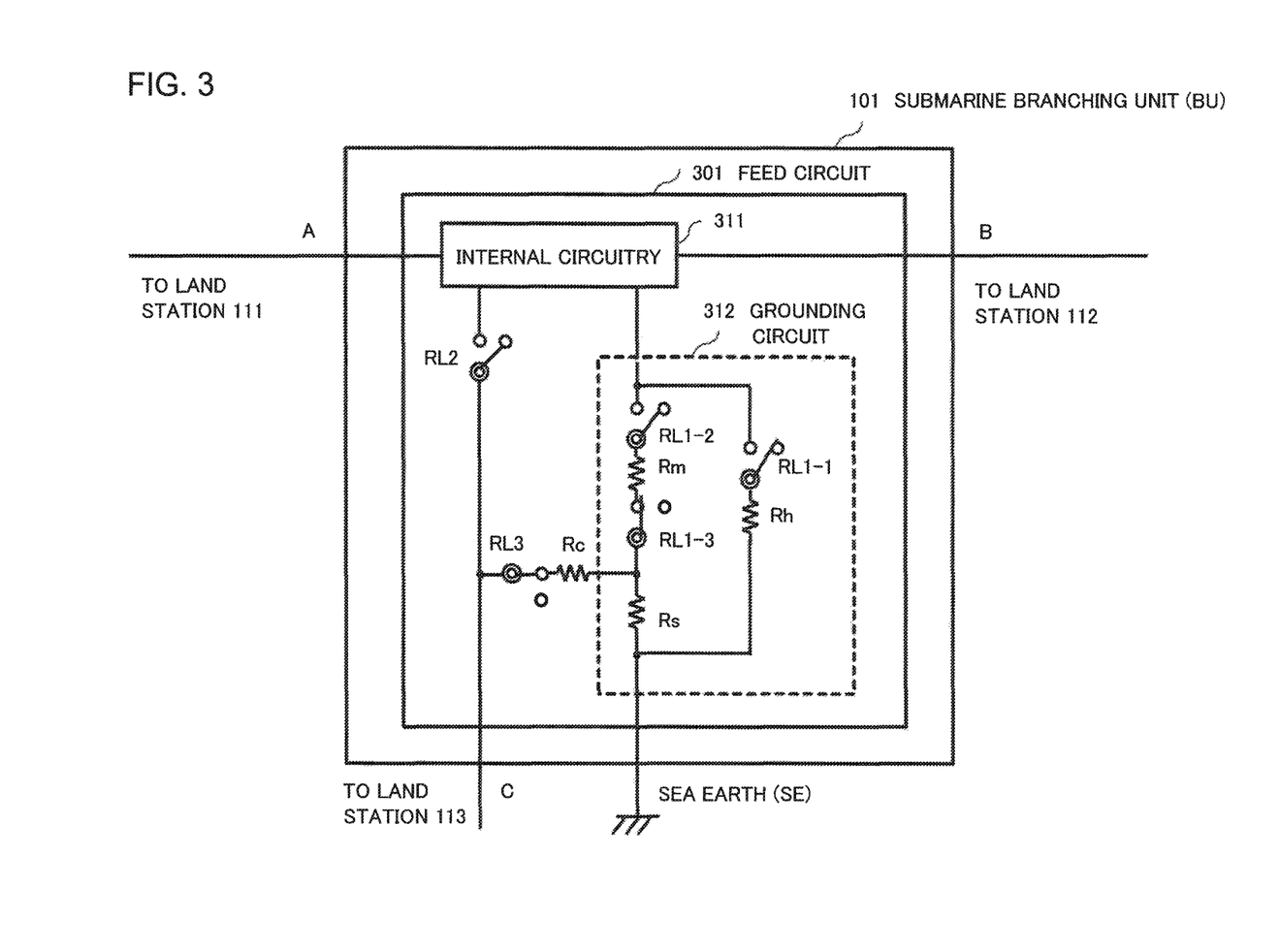
FIG. 3 is a diagram for explaining a configuration of a feed circuit 301 of the BU 101.

FIG. 3 is a diagram for explaining a configuration of the feed circuit 301 of the BU 101. The feed circuit 301 includes internal circuitry 311, a grounding circuit 312, relays RL2 and RL3, and a resistance Rc. The feed circuit 301 supplies power to the internal circuitry 311. The internal circuitry 311 includes electrical circuits for implementing the functions of the BU 101 and a feeding functional unit for supplying power to the electrical circuits. The electrical circuits included in the internal circuitry 311 are the O/E converter 212, the relay control circuit 213, and the relay driving circuit 214 depicted in FIG. 2, for example, and an electrical circuit used for relaying signals (main signals) transmitted between the land stations 111 to 113. However, the internal circuitry 311 may be disposed within the BU 101 and outside the feed circuit 301. The internal circuitry 311 is supplied with power through feeding paths connected to terminals A, B, and C of the BU 101. The terminals A, B and C are connected to the land stations 111, 112, and 113, respectively, through submarine cables.

The grounding circuit 312 includes resistances Rh, Rm and Rs and relays RL1-1, RL1-2 and RL1-3. The resistance Rh has a resistance value greater than the resistance values of the resistances Rm and Rs. An enameled resistance or the like, which is capable of withstanding large power, is used as the resistance Rh. The resistance Rm is a resistance that has a medium resistance value, compared with the resistance values of the resistances Rh and Rs. The resistance Rs is a resistance that has a small resistance value, such as several ohms. A relation among the resistance values of the resistances Rh, Rm and Rs is Rh>Rm>Rs and Rh>Rm+Rs.

The feed circuit 301 further includes relays RL2 and RL3 and a resistance Rc. The relay RL2 is made when the feeding path connected to the terminal A is to be connected to a sea earth (SE). The relay RL3 is closed when the feed circuit connected to the terminal A or the terminal C is to be connected to the SE. The resistance Rc is a resistance that has a medium resistance value and acts as a protective resistance when the terminal A or the terminal C is connected to the SE. In the present example embodiment, the internal circuitry 311 is supplied with power through the feeding paths connected to the terminal A and the terminal B and a feeding path connected to the terminal C is normally connected to the SE. Accordingly, the relay RL2 is normally open and the relay RL3 is normally closed in the present example embodiment. A case will be described below in which the feeding path from the terminal B is connected to the ground. Note that the connection configuration of the relays RL2 and RL3 and the resistance Rc in FIG. 3 and the subsequent drawings of the present example embodiment is illustrative only and is not intended to limit the configuration of the feed circuit 301 to which the grounding circuit 312 is applied. A circuit that has a different configuration depending on specifications for the power feeding system 100 in which the BU 101 is used can be used as a circuit connected to the terminal A and the terminal C for supplying power or grounding.

The relays RL1-1, RL1-2, RL1-3, RL2 and RL3 are equivalent to the relay 215 depicted in FIG. 2. The relays independently operate and switch the state of connection of the feed circuit 301 to the SE based on a signal output from the relay driving circuit 214.

Description of Operations

Figure 7:
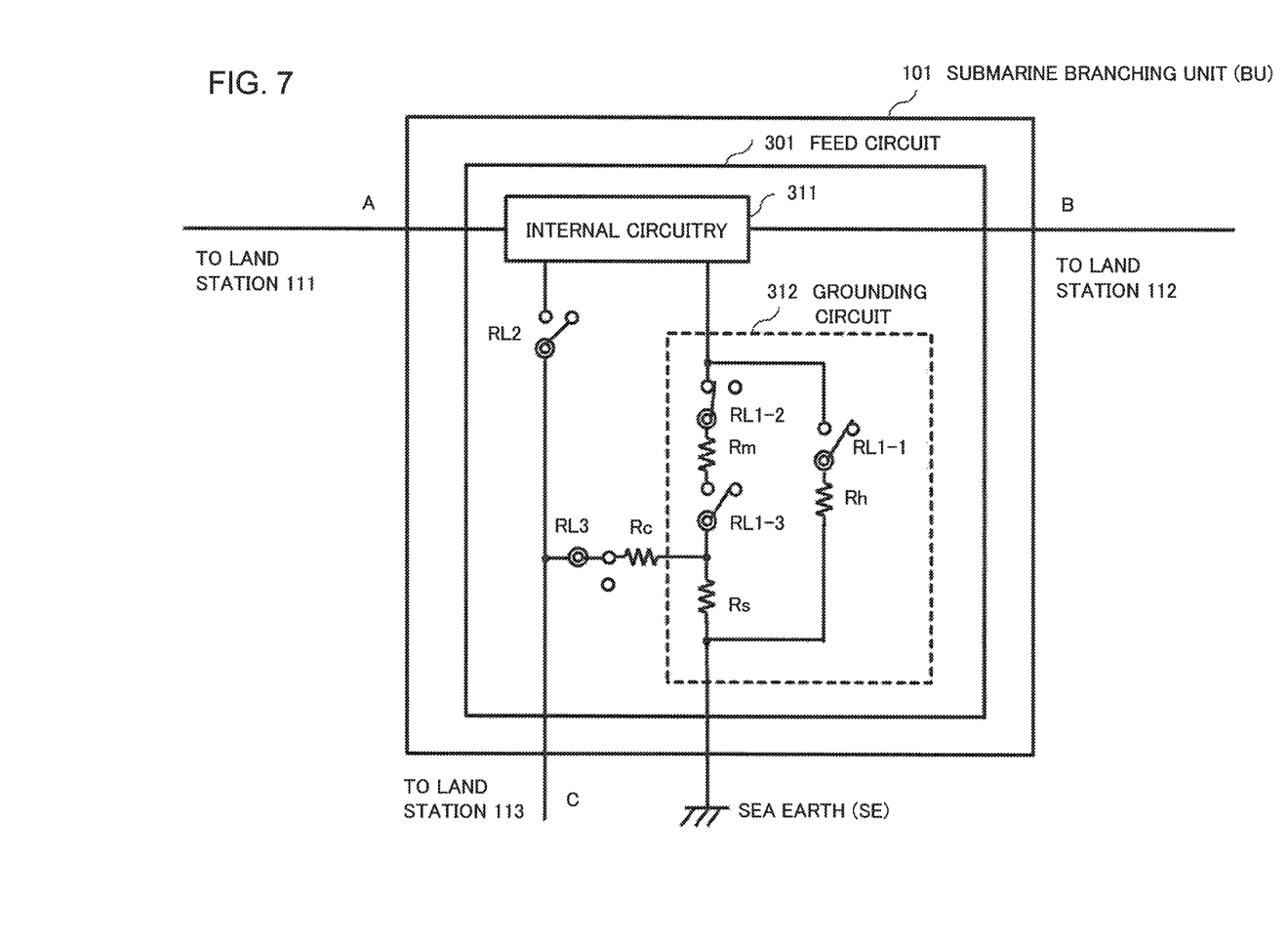
FIG. 7 is a diagram illustrating an example of switching states of the relays.
Figure 8:
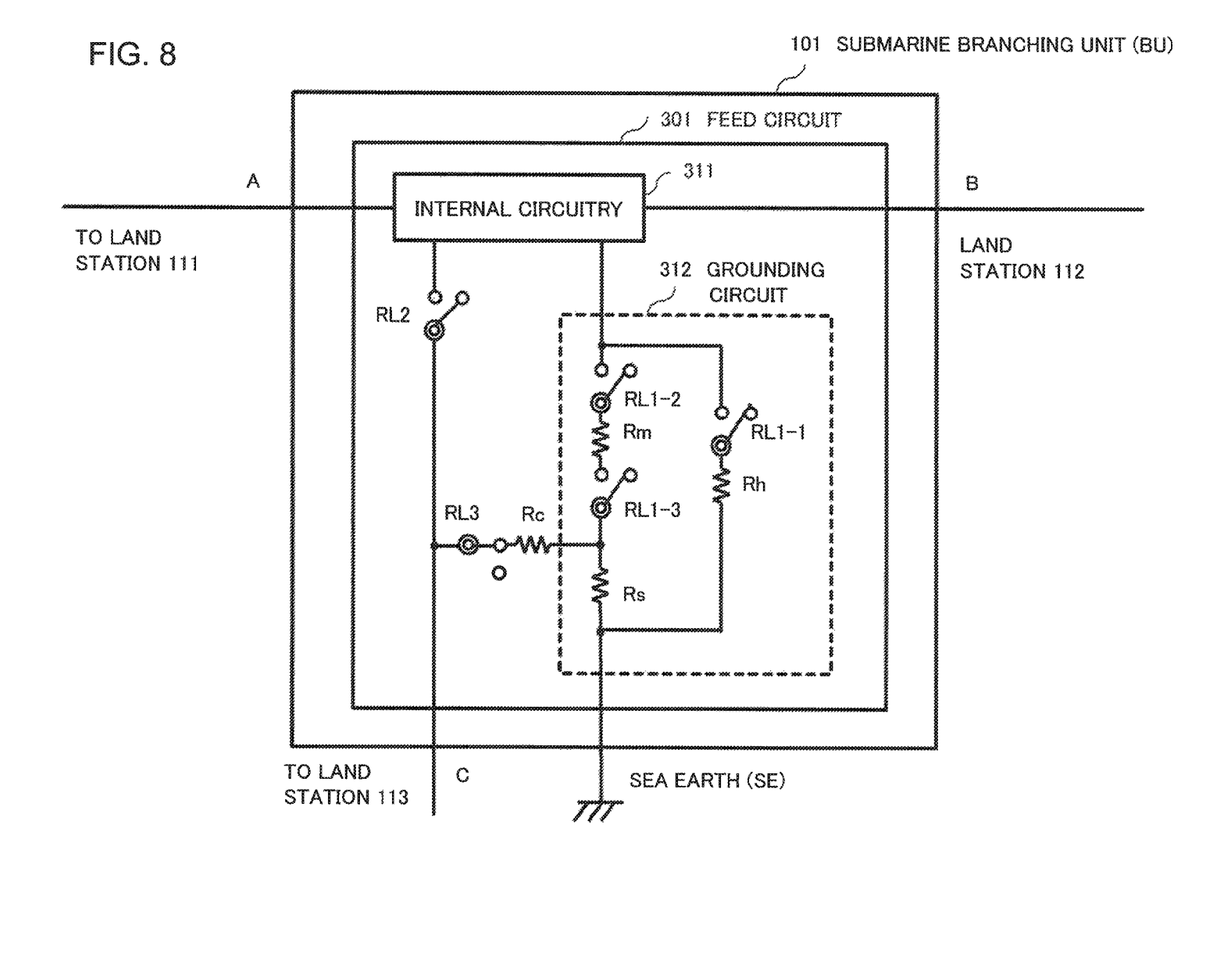
FIG. 8 is a diagram illustrating an example of switching states of the relays.
Figure 9:
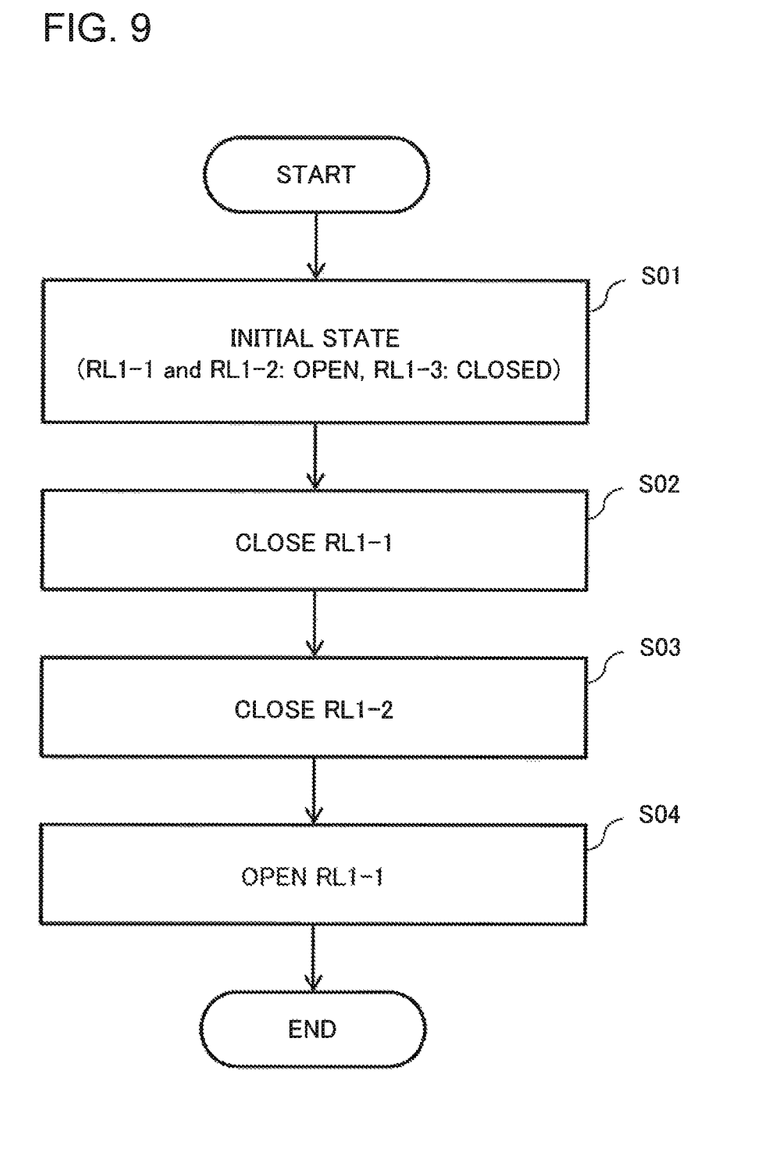
FIG. 9 is a flowchart illustrating an example of a procedure for controlling each relay.
Figure 10:
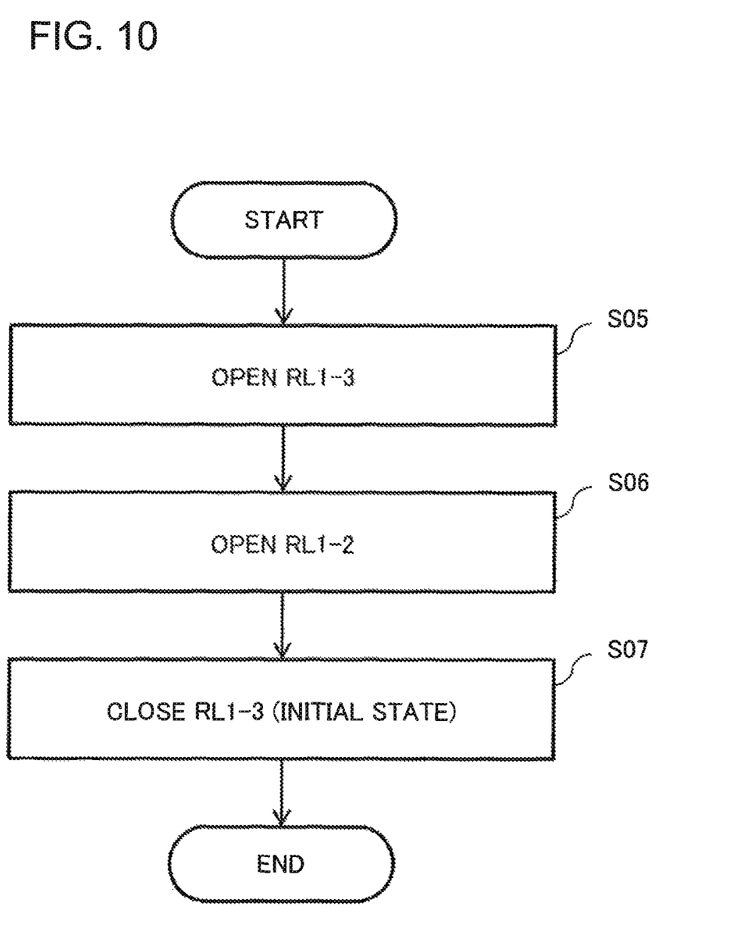
FIG. 10 is a flowchart illustrating an example of a procedure for controlling each relay.

Operations of the grounding circuit 312 will be described by using FIGS. 3 to 10. FIG. 3 illustrates an initial switching state of the contact of each relay. FIGS. 4 to 8 illustrate examples of switching states of the relays, which are different from the switching states in FIG. 3. FIGS. 9 and 10 are flowcharts illustrating examples of procedures for controlling the relays by the relay control circuit 213. A procedure for controlling the relays by the relay control circuit 213 will be described below. The relay control circuit 213 controls each relay based on a relay control signal generated by the control unit 121.

In the initial state illustrated in FIG. 3, the relays RL1-1, RL1-2 and RL2 are open (non-conducting) and the relays RL1-3 and RL3 are closed (conducting). The BU 101 is supplied with power through the feeding path connected to the terminal A and the feeding path connected to the terminal B. The feeding path of the terminal C is connected to the SE. In the state in FIG. 3, the internal circuitry 311 is not connected to the SE. Note that the operation described below may be performed when the control unit 121 depicted in FIG. 1 detects that a feeding voltage of the internal circuitry 311 is high (at a high potential).

Any of the land stations 111 to 113 that has received a relay control signal generated by the control unit 121 converts the relay control signal to an optical signal and sends the optical signal to the BU 101. The relay control signal is transmitted through a submarine cable and reaches the BU 101. As described with reference to FIG. 2, the O/E converter 212 converts the received optical signal to an electrical signal. In accordance with a content in the relay control signal sent by the control unit 121, the relay control circuit 213 outputs a signal to the relay driving circuit 214 in such a way as to cause a relevant relay to operate. Based on an instruction from the relay control circuit 213, the relay driving circuit 214 controls the relevant relay. Through the procedure as described above, relays in the BU 101 are switched by a relay control signal from the control unit 121.

Figure 4:
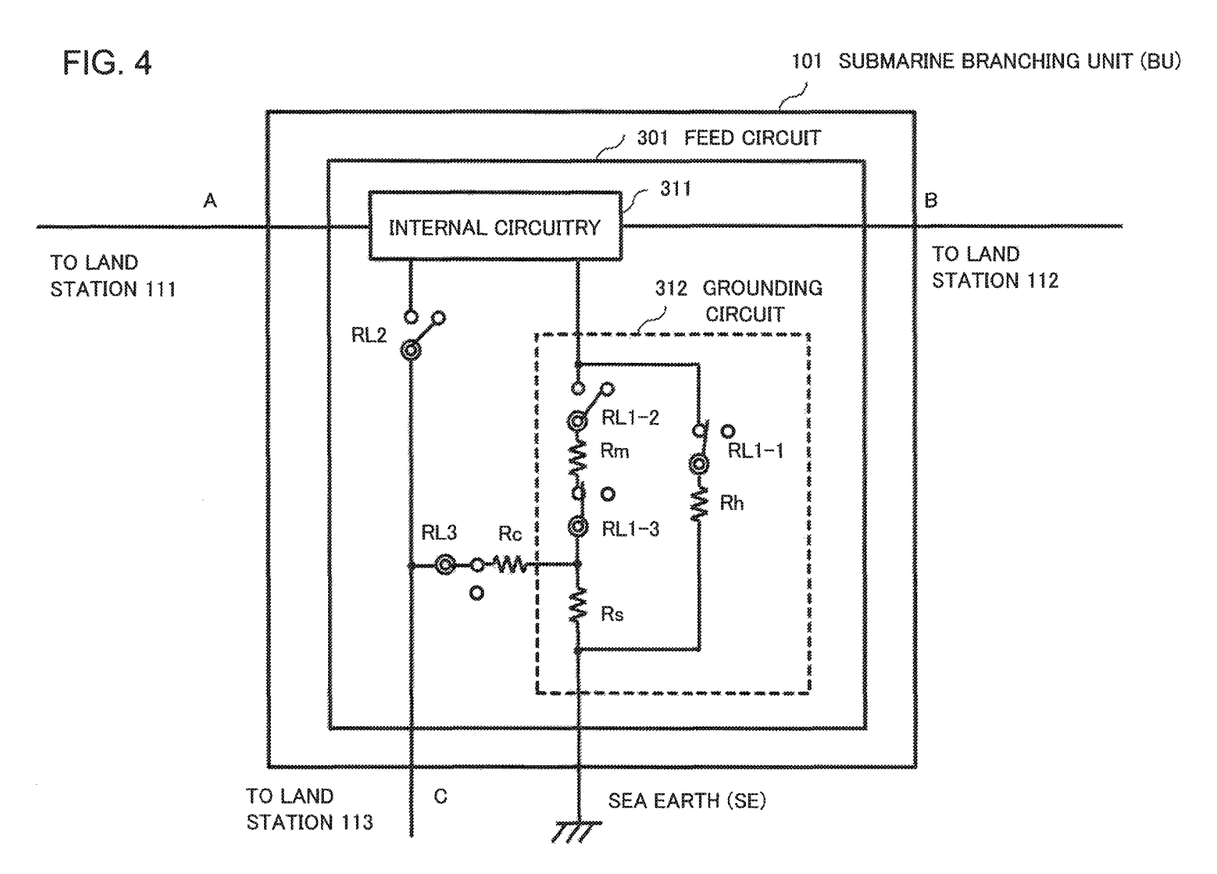
FIG. 4 is a diagram illustrating an example of switching states of relays.
Figure 5:
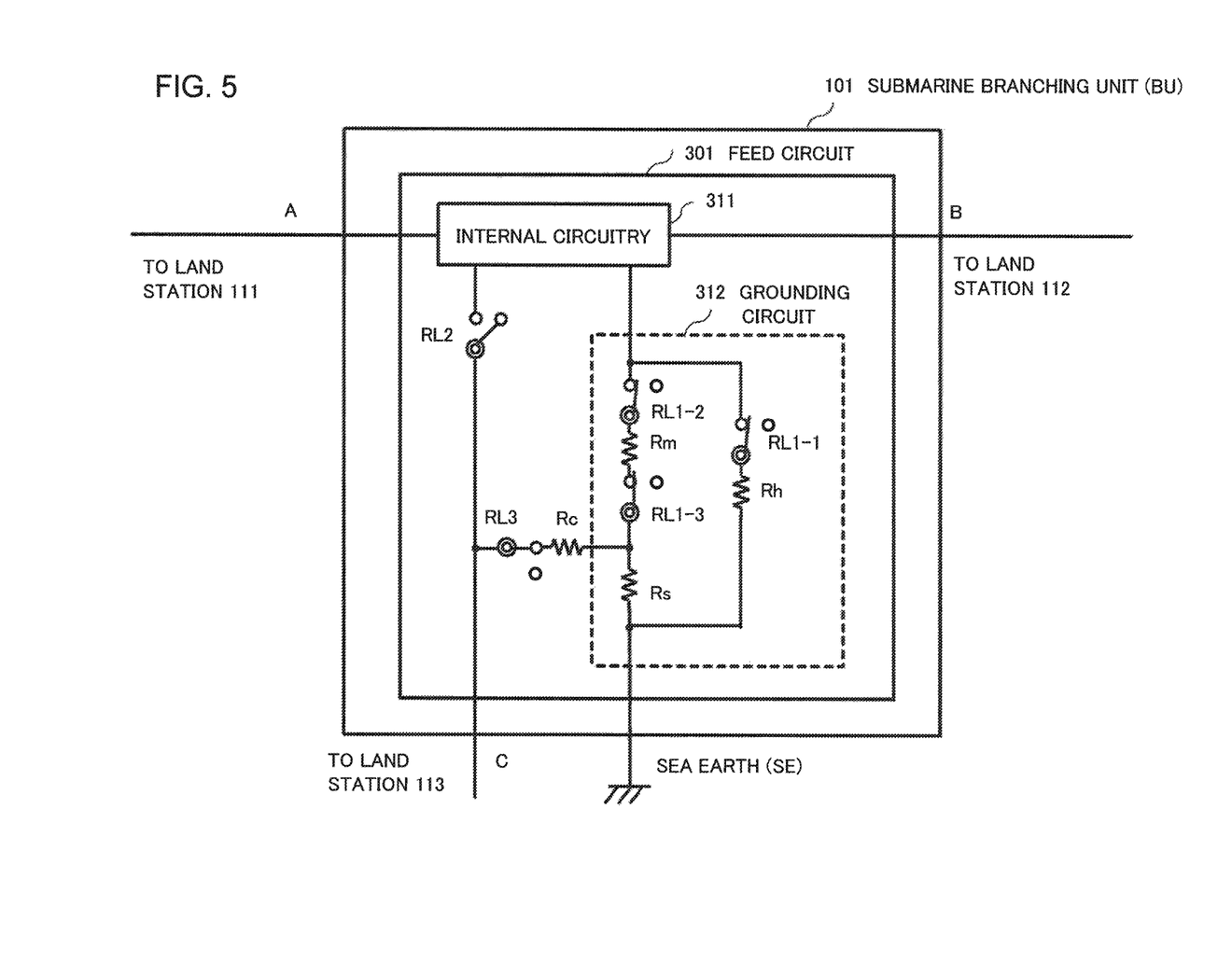
FIG. 5 is a diagram illustrating an example of switching states of the relays.

When a procedure for grounding the feed circuit of the terminal B to the SE is started from the initial state in FIG. 3 (step S01 in FIG. 9), first the relay control circuit 213 controls the relay RL1-1 to switch the contact from open to closed (step S02 in FIG. 9 and FIG. 4). As a result, current flows through the resistance Rh and the internal circuitry 311 is connected to the SE. The resistance Rh is a high resistance such as an enameled resistance and is capable of withstanding hot switching from high voltage even when the voltage of the feed circuit is high.

After the relay RL1-1 has been closed, the potential of the internal circuitry of the BU 101 decreases. After the potential has decreased, the relay control circuit 213 closes the relay RL1-2 (step S03 and FIG. 5). By closing the relay RL1-2, a circuit consisting of the resistance Rm and the resistance Rs connected in series is also connected to the SE. In other words, current to the SE also flows through the path of the combined resistance of the resistances Rm and Rs.

Figure 6:
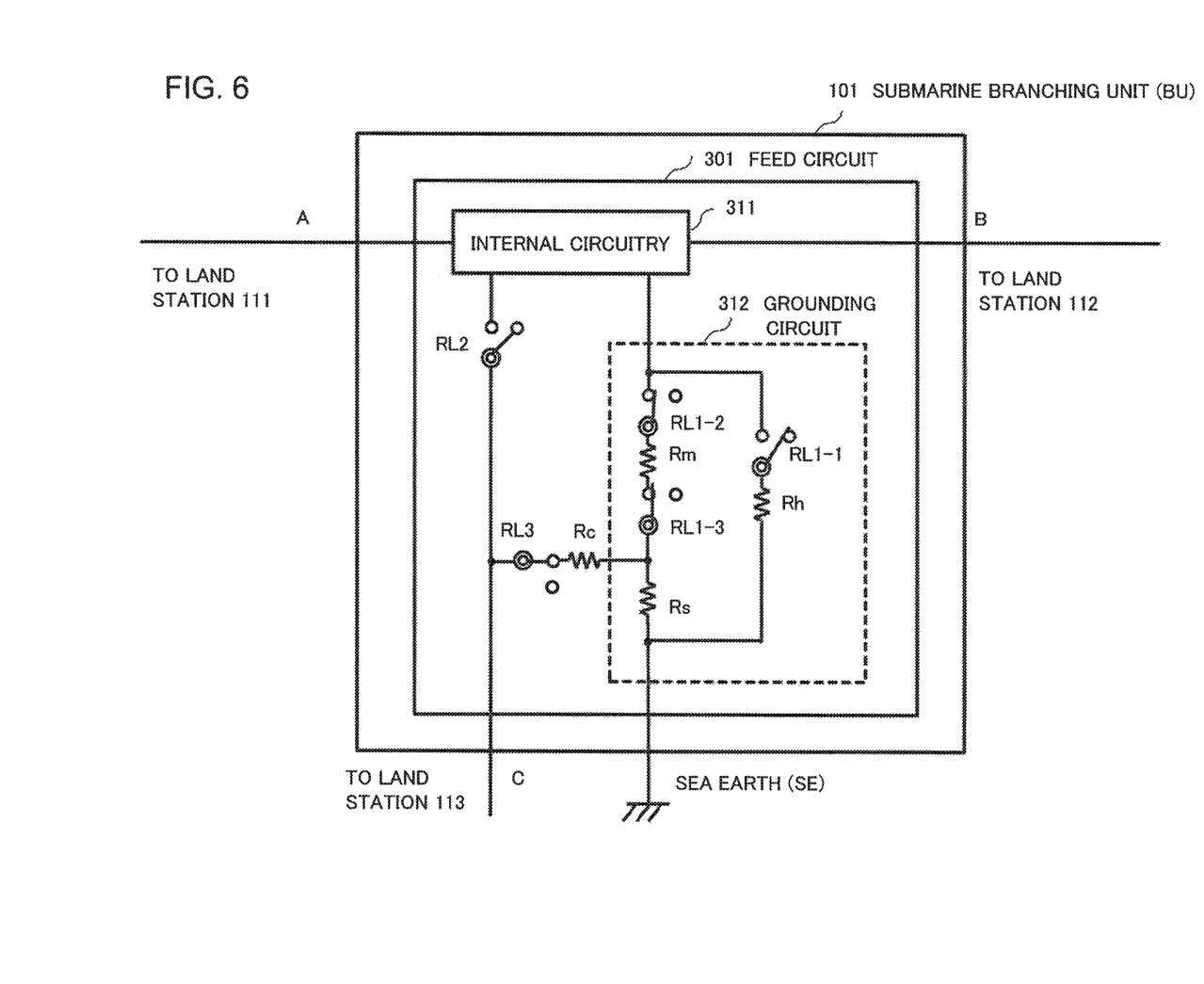
FIG. 6 is a diagram illustrating an example of switching states of the relays.

After closing the relay RL1-2, the relay control circuit 213 opens the relay RL1-1 (step S04 and FIG. 6). Since the current no longer flows to the resistance Rh as a result that the relay RL1-1 is opened, power consumption and amount of heat generation decrease while the BU 101 is grounded to the SE. With the procedure up to step S04, the operation for connecting to the SE by the grounding circuit 312 ends.

A procedure for disconnecting the connection to the SE, which is illustrated in FIG. 6, will be described next with reference to FIGS. 7 to 8 and FIG. 10. When removing a state of being grounded to the SE, the relay control circuit 213 first opens the relay RL1-3, thereby disconnecting the feed circuit from the SE (step 05 in FIG. 10 and FIG. 7). Here, the resistance Rs between the relay RL1-3 and the SE is a relatively small resistance (several ohms, for example) and the voltage applied to the relay RL1-3 is divided between the resistance Rm and the resistance Rs. Accordingly, the voltage between the SE and the relay RL1-3 can be reduced. Consequently, generation of arc discharge at the relay RL1-3 can be suppressed by choosing resistances Rm and Rs that make the voltage on the contact of the relay RL1-3 during switching of the relay RL1-3 lower than the voltage at which arc discharge is generated.

After opening the relay RL1-3, the relay control circuit 213 opens the relay RL1-2 (step S06 and FIG. 8), then further closes the relay RL1-3 (step S07). Since no current flows through the relays RL1-2 and RL1-3 in steps S06 and S07, no adverse effect on the relay contacts due to large current or arc discharge occurs in steps S06 and S07. With the execution of the procedure in step S07, the grounding circuit 312 returns to the initial state in FIG. 3.

As described above, in the present example embodiment, when the internal circuitry 311 is to be grounded to the SE, the internal circuitry 311 is first grounded by the resistance Rh which has a high resistance value. Then, the internal circuitry 311 is grounded by the resistance Rm and the resistance Rs. When the state of being grounded to the SE is to be removed, the relay RL1-3 disposed between the resistance Rm and the resistance Rs is used to cut off the ground current. In doing so, the voltage applied to the relay RL1-3 is divided by the resistances Rm and Rs. Consequently, the grounding circuit 312 according to the present example embodiment can suppress both large current generated during grounding and arc discharge generated during removal of grounding in switching of power feeding to the BU 101.

Second Example Embodiment

The switching function of the feed circuit provided in the BU 101 described in the first example embodiment can also be implemented by a grounding circuit 312 alone. Another mode of the grounding circuit 312 will be described below. In the description of a second example embodiment, reference signs of elements that correspond to elements in FIGS. 3 to 8 are indicated in parentheses. First to third relays (relays RL1-1 to RL1-3) operate according to the same procedures as the procedures in the first example embodiment.

The grounding circuit 312 is a grounding circuit that is used for connecting a feeding path to a ground (for example an SE). The grounding circuit 312 includes a first relay (RL1-1), a second relay (RL1-2), a third relay (RL1-3), a first resistance (Rh), and a voltage divider (Rm and Rs). The first resistance is a resistor that is connected in series with the first relay and is connectable in such a way as to connect the feeding path to the ground by the first relay.

The voltage divider is connected in series with the second relay and the third relay. The voltage divider divides voltage between the feeding path and the ground and the third relay is disposed at a point at which the voltage is divided by the voltage divider.

When the feeding path is to be grounded, the first to third relays are controlled in such a way as to connect the circuit as follows. First, the feeding path is grounded by the first relay via the first resistance. Then, the voltage divider is connected in parallel with the first resistance by the second and the third relays and only the grounding by the first resistance is cut off by the first relay.

When grounding of the feed circuit is to be removed, the first to third relays are controlled first in such a way that ground current is cut off by the third relay.

In the second example embodiment, when the feeding path is to be connected to the ground, first only the first resistance which has a high resistance value is grounded. After the potential of the feeding path decreases as a result of the grounding by the first resistance, grounding is further effected by the voltage divider, then the grounding by the first resistance is cut off.

Further, voltage applied to the third relay is divided by the voltage divider connected in series between the feeding path and the ground. Since the voltage applied to the third relay when the ground current is cut off by using the third relay is thus divided, generation of arc discharge during the removal of grounding can be suppressed. In other words, the grounding circuit according to the second example embodiment can suppress both large current generated during grounding and arc discharge generated during removal of grounding.

Variation of Second Example Embodiment

A configuration and operation of a grounding circuit 312 can also be described as follows. The grounding circuit 312 includes first to third relays (RL1-1 to RL1-3), a first resistance (Rh), a second resistance (Rm), and a third resistance (Rs). One end of the first relay is connected to a feeding path, another end of the first relay is connected to one end of the first resistance (Rh), and another end of the first resistance is grounded. One end of the second relay is connected to the feeding path and another end of the second relay is connected to one end of the second resistance. Another end of the second resistance is connected to one end of the third relay and another end of the third relay is connected to one end of the third resistance. Another end of the third resistance is grounded. The second resistance and the third resistance are connected in series via the third relay. In other words, the second resistance and the third resistance can be said to be a voltage dividing circuit that can be connected between the feeding path and the ground.

In the variation of the second example embodiment, when the feeding path is to be connected to the ground, first only the first resistance which has a high resistance value is grounded. After the potential of the feeding path decreases as a result of the grounding by the first resistance, grounding is further effected by the second and third resistances, then the grounding by the first resistance is cut off.

Further, voltage applied to the third relay is divided by the second and third resistances connected in series between the feeding path and the ground. Since the voltage applied to the third relay when the ground current is cut off by using the third relay is thus divided, generation of arc discharge generated during removal of grounding can be suppressed. In other words, the grounding circuit according to the variation of the second example embodiment can suppress both large current generated during grounding and arc discharge generated during removal of grounding.

While the present invention has been described with reference to example embodiments thereof, the present invention is not limited to the example embodiments described above. Various changes that can be understood by those skilled in the art can be made to configurations and details of the present invention within the scope of the present invention.

The functions and the procedures of the grounding circuit 312 described in each of the example embodiments described above may be implemented by execution of a program by the control unit 121, or a central processing unit (CPU) provided in the relay control circuit 213. The program is recorded on a fixed non-transitory recording medium. As the recording medium, a semiconductor memory or a fixed magnetic disk device may be used, but not limited to these. The CPU may be a computer provided in the control unit 121, or in the relay control circuit 213, for example, but is not limited to these arrangements.

This application is based upon and claims the benefit of priority from Japanese Patent Application No. 2016-028066 filed on Feb. 17, 2016, the entire disclosure of which is incorporated herein.

REFERENCE SIGNS LIST

100 Power feeding system
111 to 113 Land station
121 Control unit
211 Optical coupler
212 O/E converter
213 Relay control circuit
214 Relay driving circuit
215 Relay
301 Feed circuit
311 Internal circuitry
312 Grounding circuit
901 Submarine branching unit
910 Internal circuitry
991 to 993 Land station

What is claimed is:

1. A grounding circuit used for connecting a feeding path to a ground, the grounding circuit comprising:
a first relay, a second relay, and a third relay;
a first resistance that is connected in series with the first relay and is capable of connecting the feeding path to the ground by using the first relay; and
a voltage divider connected in series with the second relay and the third relay and is connectable in such a way as to divide voltage between the feeding path and the ground, wherein:
the third relay is disposed at a point at which the voltage is divided;
upon the feeding path being to be connected to the ground, the first to third relays are controlled in such a way that the feeding path is connected to the ground via the first resistance by the first relay, the voltage divider is connected in parallel with the first relay and the first resistance by the second and third relays, and a connection to the ground by the first resistance is cut off by the first relay; and
upon a connection of the feeding path to the ground being to be disconnected, the first to third relays are controlled in such a way that a ground current is cut off by the third relay.

2. The grounding circuit according to claim 1, wherein:
one end of the first relay is connected to the feeding path, another end of the first relay is connected to one end of the first resistance, and another end of the first resistance is connected to the ground; and
the voltage divider includes a second resistance and a third resistance, one end of the second relay is connected to the feeding path, another end of the second relay is connected to one end of the second resistance, another end of the second resistance is connected to one end of the third relay, another end of the third relay is connected to one end of the third resistance, and another end of the third resistance is connected to the ground.

3. A submarine branching unit comprising:
the grounding circuit according to claim 1 that includes a function of grounding a feeding path from a land station by connecting the feeding path to a sea earth;
an optical/electrical (O/E) converter configured to receive an optical signal including a relay control signal from the land station and convert the optical signal to an electrical signal;
a relay controller configured to regenerate the relay control signal from the electrical signal; and
a relay driver configured to drive a relay provided in the grounding circuit, based on the relay control signal.

4. A power feeding system comprising:
the submarine branching unit according to claim 3,
a controller configured to generate a relay control signal for controlling a relay of a grounding circuit provided in the submarine branching unit; and
a land station that is connected to the submarine branching unit and configured to transmit the relay control signal generated by the controller to the submarine branching unit.

5. The power feeding system according to claim 4, wherein
the controller further includes a function of detecting a voltage potential of a feeding path of the submarine branching unit, and, upon the voltage potential being equal to or greater than a predetermined value, controls the first to third relays.

6. A grounding method for connecting a feeding path to a ground, the method comprising:
connecting a first relay with a first resistance in series;
connecting a second relay with a voltage divider and a third relay in series;
disposing the third relay at a point at which voltage between the feeding path and the ground is divided by the voltage divider;
upon the feeding path being to be connected to the ground,
controlling the first to third relays in such a way as to,
by the first relay, connect the feeding path to the ground via the first resistance,
by the second and third relays, connect the voltage divider with the first relay and the first resistance in parallel, and
by the first relay, cut off only a connection to the ground by the first resistance; and
upon a connection of the feeding path to the ground being to be disconnected,
controlling the first to third relays in such a way as to cut off a ground current by the third relay.

7. The grounding method according to claim 6, comprising
connecting one end of the first relay to the feeding path, connecting another end of the first relay to one end of the first resistance, and connecting another end of the first resistance to the ground, wherein
the voltage divider includes a second resistance and a third resistance, and
the method comprises:
connecting one end of the second relay to the feeding path, connecting another end of the second relay to one end of the second resistance, connecting another end of the second resistance to one end of the third relay, connecting another end of the third relay to one end of the third resistance, and connecting another end of the third resistance to the ground.

8. A tangible and non-transitory recording medium on which a control program for a computer used in a grounding circuit that includes a function of connecting a feeding path to a ground is recorded, wherein
the grounding circuit includes
a first relay, a second relay, a third relay, a first resistance that is connected in series with the first relay and is capable of connecting the feeding path to the ground by the first relay, and a voltage divider that is connected in series with the second relay and the third relay and is connectable in such a way as to divide voltage between the feeding path and the ground, the third relay being disposed at a point at which the voltage is divided, and
the control program causes the computer to perform procedures of:
upon the feeding path being to be connected to the ground, controlling the first to third relays in such a way that the feeding path is connected to the ground via the first resistance by the first relay, the voltage divider is connected in parallel with the first relay and the first resistance by the second and third relays, and further, a connection to the ground by the first resistance is cut off by the first relay; and
upon a connection of the feeding path to the ground being to be disconnected, controlling the first to third relays in such a way that a ground current is cut off by the third relay.

9. A submarine branching unit comprising:
the grounding circuit according to claim 2 that includes a function of grounding a feeding path from a land station by connecting the feeding path to a sea earth;
an optical/electrical (O/E) converter configured to receive an optical signal including a relay control signal from the land station and convert the optical signal to an electrical signal;
a relay controller configured to regenerate the relay control signal from the electrical signal; and
a relay driver configured to drive a relay provided in the grounding circuit, based on the relay control signal.

10. A power feeding system comprising:
the submarine branching unit according to claim 9,
a controller configured to generate a relay control signal for controlling a relay of a grounding circuit provided in the submarine branching unit; and
a land station that is connected to the submarine branching unit and configured to transmit the relay control signal generated by the controller to the submarine branching unit.

11. The power feeding system according to claim 10, wherein
the controller further includes a function of detecting a voltage potential of a feeding path of the submarine branching unit, and, upon the voltage potential being equal to or greater than a predetermined value, controls the first to third relays.

* * * * *